United States Patent [19]
Clayton

[11] Patent Number: 5,461,225
[45] Date of Patent: Oct. 24, 1995

[54] SAMPLING METHODS AND APPARATUS

[75] Inventor: Richard D. Clayton, Kanata, Canada

[73] Assignee: Northern Telecom Limited, Montreal, Canada

[21] Appl. No.: 53,748

[22] Filed: Apr. 29, 1993

[30] Foreign Application Priority Data

Aug. 11, 1992 [CA] Canada ................................ 2075741

[51] Int. Cl.$^6$ .................................................. H01J 40/14
[52] U.S. Cl. ......................................... 250/214 R; 327/9
[58] Field of Search ........................ 250/214 R, 214 DC, 250/208.2, 206; 327/9, 10, 3, 2

[56] References Cited

U.S. PATENT DOCUMENTS 4,127,848  11/1978  Shanks ........................................ 345/87
4,996,871   3/1991  Romano ....................................... 73/32 A Primary Examiner—Edward P. Westin
Assistant Examiner—John R. Lee
Attorney, Agent, or Firm—C. W. Junkin

[57] ABSTRACT

In novel sampling methods and apparatus, a repetitive waveform is sampled at a sampling phase which alternates at a phase alternation frequency between a fixed reference phase and a variable phase while changing the variable phase progressively and periodically. The amplitude of a component of the resulting signal at the phase alternation frequency is detected to derive a lower frequency analog of the sampled waveform. The sampling methods and apparatus are particularly useful for electro-optic sampling of very high frequency waveforms in semiconductor devices.

15 Claims, 2 Drawing Sheets

SAMPLING METHODS AND APPARATUS

FIELD OF THE INVENTION

This invention relates to methods for sampling repetitive waveforms and to apparatus for performing such methods.

BACKGROUND OF THE INVENTION

In conventional synchronous signal sampling methods, high frequency repetitive waveforms are sampled at sampling points having a known phase relative to the repetitive waveform, and the phase of the sampling points is varied relatively slowly to reconstruct a signal which is a lower frequency analog of the high frequency repetitive waveform.

Such sampling is commonly performed using an electronic shutter. However, electro-optic sampling techniques have been developed for very high frequency waveforms which cannot be sampled readily using an electronic shutter. In these electro-optic sampling techniques, a series of very short optical pulses having a known polarization are passed through a semiconductor device in the vicinity of a conductor carrying the very high frequency waveform to be sampled. Electric fields due to the signal carried in the conductor affect the polarization of the optical pulses as they pass through the semiconductor, and the resulting changes in polarization are detected by a polarization-sensitive optical detector. As the optical pulses are affected by the electric fields only for the length of each optical pulse and the time it takes each optical pulse to pass through the field-affected region of the semiconductor device (both of the order of picoseconds), the time-averaged optical signal is representative of the waveform sample, and the polarization-sensitive detectors do not need to be particularly fast.

The sample signals obtained in this manner are quite small, so noise can be a problem. According to a conventional noise reduction technique, the high frequency waveform to be sampled can be modulated at a known frequency, the modulated signal can be sampled to generate a sample signal, and the amplitude of a component of the sample signal at the known modulation frequency can be detected to reduce out of band noise.

Unfortunately, such modulation may perturb the operation of the semiconductor device. This is particularly true for digital semiconductor devices which may change state as a result of the modulation of the high frequency waveform, so that the reconstructed waveform is not representative of the high frequency waveform which would result if modulation were not applied.

According to another noise reduction technique, the phase of the sampling point can be modulated at a frequency higher than the predicted noise bandwidth and the reconstructed signal can be passed through a high pass filter to reduce low frequency noise. The results of several scans can also be averaged for further noise reduction. Unfortunately, sophisticated electronics are required to cope with the high scan frequency.

According to yet another noise reduction technique, the phase of the sampling point can be dithered at a high frequency, and the reconstructed signal can be passed through a narrow bandpass filter centered on the dither frequency. Such dithered sampling gives a representation of the derivative of the sampled waveform which can be integrated to get a representation of the high speed waveform. Unfortunately, the integration step adds some noise back into the reconstructed waveform.

According to still another noise reduction technique, the polarization of the optical pulses can be modulated to modulate the sensitivity of the optical pulse polarization to the fields generated by the signal being sampled. Unfortunately, polarization modulation requires sophisticated electro-optical devices, and is sensitive to unintentional bias and drift.

SUMMARY OF THE INVENTION

This invention seeks to provide sampling methods which reduce or overcome the disadvantages of known sampling methods as described above. This invention further seeks to provide apparatus for performing such sampling methods.

One aspect of the invention provides a method for sampling a repetitive waveform. The method comprises sampling the waveform at a sampling phase which alternates at a phase alternation frequency between a fixed reference phase and a variable phase, while changing the variable phase progressively and periodically, and detecting the amplitude of a component of the resulting signal at the phase alternation frequency.

Preferably, the waveform is sampled at a sampling frequency which exceeds the phase alternation frequency such that a plurality of successive samples is taken at each sampling phase. The variable phase may be changed in progressive steps at a step rate which is lower than the phase alternation frequency such that the variable phase is fixed for a plurality of successive alternations of the sampling phase.

Preferably, a trigger pulse synchronized to the waveform is generated, a delayed trigger pulse having a variable delay with respect to the trigger pulse is generated, and sampling of the waveform is triggered by the delayed trigger pulse. The variable delay is alternated between a fixed reference delay and a progressively changing variable delay at the phase alternation frequency. The variable delay may be changed in progressive steps.

The method is particularly applicable to electro-optic sampling of very high frequency waveforms present as electrical signals on conductors of semiconductor devices. In such methods, the waveform is sampled by passing polarized optical pulses through the semiconductor device in the vicinity of the conductor and onto a polarization-sensitive optical detector. An electrical output of the optical detector is monitored to obtain the waveform samples.

Advantageously, the optical pulses may be circularly polarized before they are passed through the semiconductor device, and separated into orthogonally linearly polarized optical pulses after they pass through the semiconductor device. The orthogonally linearly polarized optical pulses may then be separately detected to generate separate electrical signals, and a difference between the separate electrical signals may be monitored for improved signal to noise characteristics.

Moreover, the method is especially applicable to the sampling of waveforms in digital devices because the waveform need not be turned on and off for lock-in noise reduction purposes, and resulting undesired changes in the state of the digital devices are thereby avoided.

Another aspect of the invention provides apparatus for sampling a repetitive waveform. The apparatus comprises a sampler for sampling the waveform at a sampling phase which alternates at a phase alternation frequency between a fixed reference phase and a variable phase while the variable phase changes progressively and periodically, and an amplitude detector for detecting the amplitude of a component of the resulting signal at the phase alternation frequency.

Preferably the sampler comprises a trigger pulse generator, a delay switch, a controller and a sampling shutter. The trigger pulse generator generates a trigger pulse synchronized to the waveform. The delay switch generates a delayed trigger pulse having a delay with respect to the trigger pulse. The controller controls the delay switch such that the delay alternates at the phase alternation frequency between a fixed reference delay and a variable delay while the variable delay changes progressively and periodically. The sampling shutter is triggered by the delayed trigger pulse for sampling the waveform.

For electro-optic sampling of waveforms which are present as electrical signals on conductors of semiconductor devices, the sampling shutter may comprise an optical source triggered by the delayed trigger pulse and a polarization-sensitive optical detector. The optical source is optically coupled to the semiconductor device for passing polarized optical pulses through the semiconductor device in the vicinity of the conductor, and may comprise an electroluminescent diode and a first polarizer. The optical detector is optically coupled to the semiconductor device for receiving the optical pulses passed through the semiconductor device and may comprise a second polarizer and a photosensitive diode.

For better signal to noise performance, the first polarizer may comprise a circular polarizer, the second polarizer may comprise a polarization-sensitive beam splitter, and the optical detector may comprise a further photosensitive diode and a difference amplifier. The polarization-sensitive beam splitter may split the optical pulses passed through the semiconductor device into pulses having orthogonal linear polarizations, and the two photosensitive diodes may be configured for separately detecting the orthogonally linearly polarized optical pulses to generate separate electrical signals. The difference amplifier may then amplify a difference between the separate electrical signals.

The apparatus may further comprise a low pass filter for filtering the output of the amplitude detector, or a display for displaying the detected amplitude.

BRIEF DESCRIPTION OF THE DRAWINGS

Embodiments of the invention are described below by way of example only. Reference is made to accompanying drawings, in which.

DETAILED DESCRIPTION OF EMBODIMENTS

Figure 1:
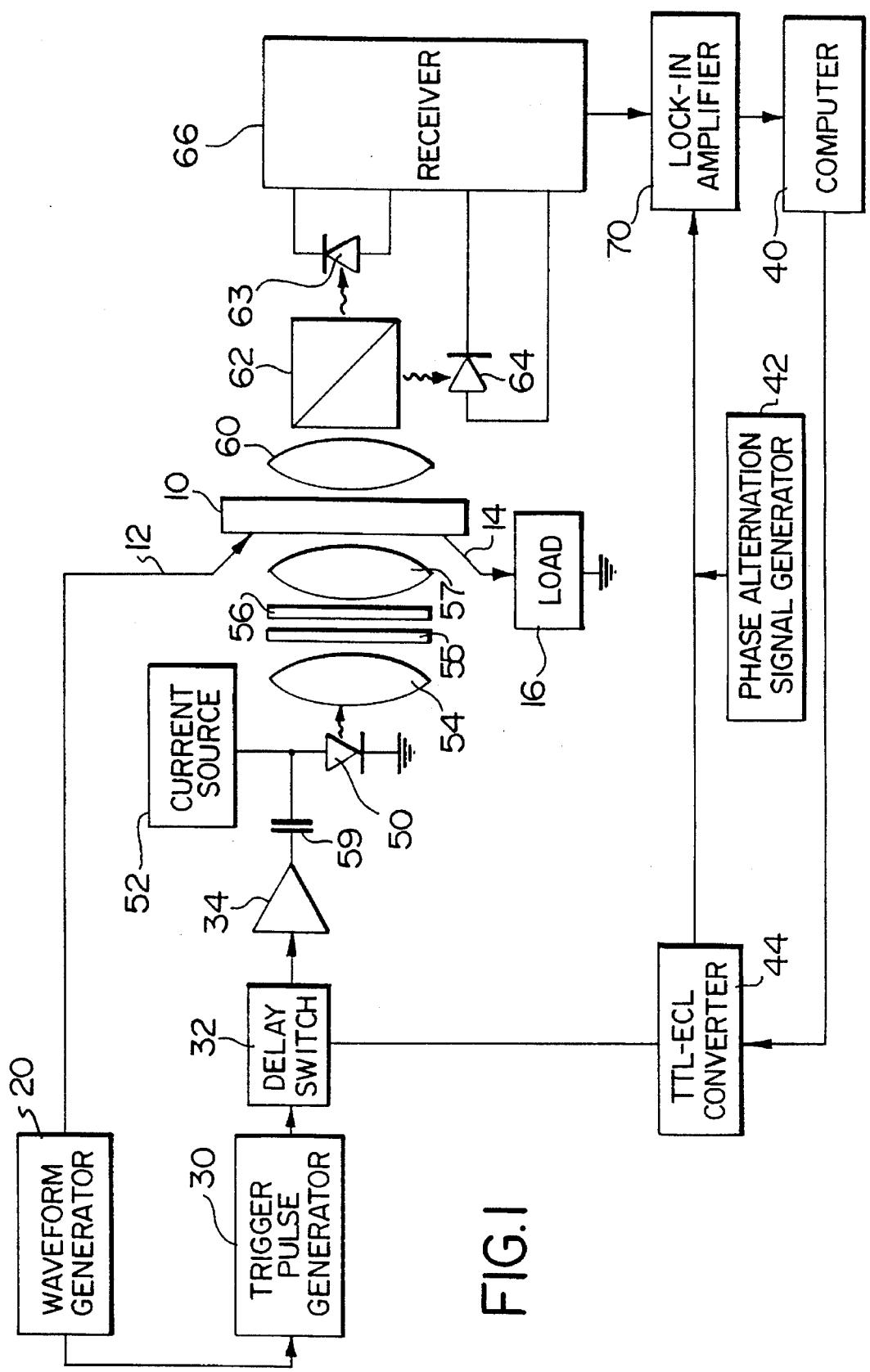
FIG. 1 is a block schematic diagram of apparatus according to an embodiment of the invention for electro-optic sampling of a high frequency waveform present as an electrical signal on a conductor of a semiconductor device.

FIG. 1 is a block schematic diagram of apparatus according to an embodiment of the invention for electro-optic sampling of a high frequency waveform present as an electrical signal on a conductor of a semiconductor device 10. The high frequency waveform is coupled to an input terminal 12 of the semiconductor device 10 from a waveform generator 20, and each output 14 of the semiconductor device 10 is coupled to a suitable load 16.

The electro-optic sampling apparatus comprises a sampler in the form of a trigger pulse generator 30, a delay switch 32, an amplifier 34, and a controller which comprises a computer 40, a phase alternation signal source 42 and a TTL-to-ECL converter 44.

The sampler further comprises an electro-optic sampling shutter comprising an optical source and an optical detector. The optical source comprises an electroluminescent diode 50, an adjustable current source 52 for biasing the electroluminescent diode 50, and a circular polarizer comprising an input lens 54, a linear polarizer 55, a quarter wave plate 56 and an output lens 57. The optical source is ac-coupled to the amplifier 34 via a coupling capacitor 59. The optical detector comprises an input lens 60, a polarization-sensitive beam splitter 62 and a pair of photosensitive diodes 63, 64. Each photosensitive diode is positioned to receive a respective output beam of the beam splitter 62, and is electrically connected to a respective channel of a two-channel receiver 66 which also forms part of the optical detector.

The sampling apparatus further comprises an amplitude detector in the form of a lock-in amplifier 70.

In operation of the electro-optic sampling apparatus, the waveform generator 20 feeds a synchronization pulse to the trigger pulse generator 30 which generates trigger pulses synchronized to the waveform. The trigger pulses are coupled to the delay switch 32. The delay switch 32 delays the trigger pulses by a delay which corresponds to an eight bit code provided by the TTL-to-ECL converter 44. The eight bit code is supplied to the TTL-to-ECL converter 44 by the computer 40 which increments the code at regular intervals defining a step rate. The phase alternation signal source 42 is connected to an override terminal of the TTL-to-ECL converter 44 and causes the TTL-to-ECL converter 44 to override the eight bit code supplied by the computer 40 at regular intervals, replacing that code with a fixed eight bit reference code. Consequently, the delay switch 32 generates delayed trigger pulses having a delay with respect to the trigger pulses, the delay asynchronously alternating between a fixed reference delay and a progressively changing variable delay at the phase alternation frequency. The step rate is lower than the phase alternation frequency so that the variable phase is fixed for a plurality of successive alternations of the sampling phase.

The delayed trigger pulses are amplified by the amplifier 34, and the amplified pulses drive the electroluminescent diode 50 to produce optical pulses. The optical pulses are circularly polarized by the adjacent linear polarizer 55 and quarter wave plate 56 and focussed by the output lens 57 on a region of the semiconductor device 10 in the vicinity of a conductor carrying the waveform to be sampled. Electric fields due to the waveform carried by the conductor induce local changes in the refractive index of the semiconductor device, and these local changes affect the polarization of the optical pulses as they pass through the semiconductor device 10. The optical pulses having altered polarization pass are collimated by the lens 60 and separated into optical pulses having orthogonal linear polarizations by the polarization-sensitive beam splitter 62, and the separated pulses are incident on the respective photosensitive diodes 63, 64 where they generate photocurrent signals. The magnitudes of the photocurrent signals depend on the polarization change induced in the optical pulses by the semiconductor device 10, which in turn depends on the waveform carried on the conductor of the semiconductor device. The receiver 66 detects and amplifies the difference in the magnitudes of the photocurrent signals and feeds the resulting difference signal to the lock-in amplifier 70.

The lock-in amplifier 70 is tuned to the phase alternation frequency provided by the phase alternation signal generator 42, and detects the amplitude of a component of the difference signal at the phase alternation frequency. The lock-in amplifier 70 includes a low pass filter which passes a low frequency component of the resulting amplitude signal and feeds the filtered signal to the computer 40 for storage or display as a lower frequency analog of the high frequency waveform carried by the conductor of the semiconductor device 10.

Figure 2:
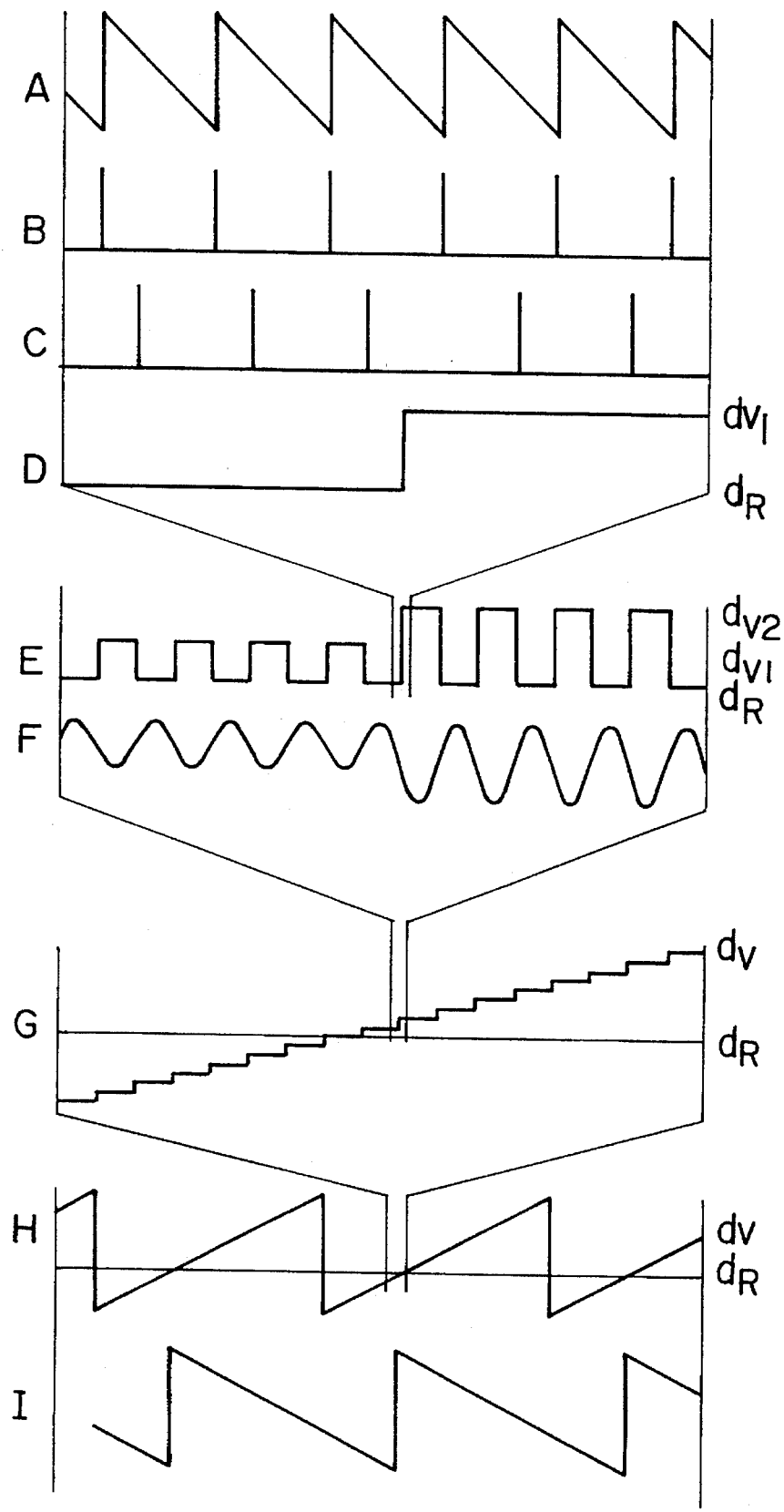
FIG. 2 is a timing diagram showing signals used in the operation of the apparatus of FIG. 1.

FIG. 2 is a timing diagram showing signals used in the operation of the apparatus of FIG. 1. An example of a high frequency repetitive waveform to be sampled is shown as signal A. Signal B is the train of trigger pulses synchronized to the waveform A, as generated by the trigger pulse generator 30. Signal C is the train of delayed trigger pulses provided by the delay switch 32. The pulses of signal C are delayed with respect to the pulses of signal B by a delay shown as a function of time as waveform D. The delay alternates between a fixed reference delay dR and a progressively changing variable delay dr, the progressively changing variable delay dv changing in fixed steps, as better illustrated by waveforms E, G and H which show the phase of the delayed trigger signal over progressively larger intervals of time. The pulses of signal C drive the electroluminescent diode 70 to provide a similar train of polarized optical pulses. Signal F is the result of difference detection by the relatively slow photosensitive diodes 63, 64 and the differential receiver 66 of the optical pulses passed through the semiconductor device 10 and separated by the polarization-sensitive beam splitter 62. The amplitude of signal F varies in accordance with the polarization change induced by the high frequency waveform in the semiconductor device 10. Signal I is provided by the lock-in amplifier 70 as a result of amplitude detection at the phase alternation frequency, followed by low pass filtering. Signal I is a lower frequency analog of the high frequency waveform A.

In an experimental demonstration of the sampling method, the equipment used was generally as listed below except for the adjustable current source 52 and the receiver 66 which were prototypes based on TLE 2021 and TLE 2024 operational amplifiers (suitable commercially available substitutes for these prototype circuits are listed below):
waveform generator 20: Anritsu MG642A
trigger pulse generator 30: Motorola MC 10E016
delay switch 32: Brooktree Bt604
amplifier 34: Hewlett-Packard 813 1A
computer 40: Hewlett-Packard 9000-320 (with 98622A GPIO interface)
phase alternation signal generator 42: Texas Instruments NE555
TTL-to-ECL converter 44: Texas Instruments SN10KHT5543
electroluminescent diode 50: Mitsubishi ML7781
adjustable current source 52: ILX 3207B
linear polarizer 55: Corning 8612
quarter wave plate 56: Optics Research RZ-1/4-1300
beam splitter 62: Optics Research PSCL-13-1300
photosensitive diodes 63, 64: EG&G J-16-8-SP-R03M-HS
receiver 66: EG&G PA-6
lock-in amplifier 70: Stanford Research SRS530

In the experimental example, the high frequency waveform had a period of approximately 10 ns, and the trigger pulse separation was approximately 20 ns. The phase alternation period was approximately 1.0 ms so that approximately 50,000 samples were taken between each phase alternation. The computer 40 incremented the variable phase approximately every 50 ms so that the variable phase was fixed for approximately 100 alternations of the sampling phase. The variable phase was incremented through 256 values corresponding to 256 distinct values of the eight bit code supplied by the computer 40.

The implementation used in our experiments added less than 10 ps (rms) jitter to the laser drive pulse, and allowed more than 25 dB signal-to-noise ratio with a 1 V input signal and a 40 Hz measurement bandwidth.

The trigger pulse separation need not match the period of the high frequency waveform provided that it is an integral multiple of the period of the high frequency waveform. In practical terms, the trigger pulse repetition rate must be high enough to provide an adequate optical signal level at the photosensitive diodes 63, 64. The phase alternation period and the rate at which the variable phase is incremented are primarily determined by the frequency characteristics of the receiver 66 and the locking amplifier 70 (including the low pass filter of the locking amplifier 70).

Variation of these parameters and other modifications are within the scope of the invention as claimed below. For example, the quarter wave plate 56 could be removed, and linearly polarized optical pulses could be passed through the semiconductor device 10. Moreover, the polarization-sensitive beam splitter 62 could be replaced with a simple linear polarizer, one of the photosensitive diodes 64 could be eliminated, and the two channel receiver 66 could be replaced with a single channel receiver. However, such modifications would reduce the detected optical signal and would require some experimentation to determine the optimum orientations of the linear polarizers.

In the demonstration system described above, trigger pulses are delayed electrically. However, the trigger pulses could be fed directly to the electroluminescent diode 50 and the resulting optical pulses could be delayed by a suitable arrangement of switchable optical delay lines or other optical elements before passage through the semiconductor device 10.

I claim:

1. A method for sampling a repetitive waveform, comprising:
   sampling the waveform at a sampling phase which alternates at a phase alternation frequency between a fixed reference phase and a variable phase while changing the variable phase progressively and periodically; and
   detecting an amplitude of a component of the resulting signal at the phase alternation frequency.

2. A method as defined in claim 1, wherein the waveform is sampled at a sampling frequency which exceeds the phase alternation frequency such that a plurality of successive samples is taken am each sampling phase.

3. A method as defined in claim 2, wherein the variable phase is changed in progressive steps at a step rate which is lower than the phase alternation frequency such that the variable phase is fixed for a plurality of successive alternations of the sampling phase.

4. A method as defined in claim 1, comprising:
   generating trigger pulses synchronized to the waveform;
   generating delayed trigger pulses having a variable delay with respect to the trigger pulses, the variable delay alternating between a fixed reference delay and a progressively changing variable delay at the phase alternation frequency; and
   triggering sampling of the waveform with the delayed trigger pulses.

5. A method as defined in claim 4, wherein the variable delay is changed in progressive steps at a step rate which is lower than the phase alternation frequency such that the variable phase is fixed for a plurality of successive alternations of the sampling phase.

6. A method as defined in claim 1, wherein:

the waveform is present as an electrical signal on a conductor of a semiconductor device; and the waveform is sampled by passing polarized optical pulses through the semiconductor device in the vicinity of the conductor and onto a polarization-sensitive optical detector and monitoring an electrical output of the optical detector.

7. A method as defined in claim 6, comprising:

circularly polarizing the optical pulses before passing them through the semiconductor device;

separating the optical pulses into orthogonally linearly polarized optical pulses after passing them through the semiconductor device;

separately detecting the orthogonally linearly polarized optical pulses to generate separate electrical signals; and monitoring a difference between the separate electrical signals.

8. A method as defined in claim 1, further comprising preferentially monitoring a low frequency component of the detected amplitude.

9. Apparatus for sampling a repetitive waveform, comprising:

a sampler for sampling the waveform at a sampling phase which alternates at a phase alternation frequency between a fixed reference phase and a variable phase while changing the variable phase progressively and periodically; and an amplitude detector for detecting an amplitude of a component of the resulting signal at the phase alternation frequency.

10. Apparatus as defined in claim 9, wherein the sampler comprises:

a trigger pulse generator for generating a trigger pulse synchronized to the waveform;

a delay switch for generating a delayed trigger pulse having a delay with respect to the trigger pulse;

a controller for controlling the delay switch such that the delay alternates at the phase alternation frequency between a fixed reference delay and a variable delay while the variable delay changes progressively and periodically; and a sampling shutter triggered by the delayed trigger pulse for sampling the waveform.

11. Apparatus as defined in claim 9, for sampling a waveform which is present as an electrical signal on a conductor of a semiconductor device, wherein the sampling shutter comprises:

an optical source triggered by the delayed trigger pulse and optically coupled to the semiconductor device for passing polarized optical pulses through the semiconductor device in the vicinity of the conductor; and a polarization-sensitive optical detector optically coupled to the semiconductor device for receiving the optical pulses passed through the semiconductor device.

12. Apparatus as defined in claim 11, wherein:

the optical source comprises an electroluminescent diode and a first polarizer; and the optical detector comprises a second polarizer and a photosensitive diode.

13. Apparatus as defined in claim 12, wherein:

the first polarizer comprises a circular polarizer;

the second polarizer comprises a polarization-sensitive beam splitter for splitting the optical pulses passed through the semiconductor device into pulses having orthogonal linear polarizations; and the optical detector comprises a further photosensitive diode and a difference amplifier, the two photosensitive diodes configured for separately detecting the orthogonally linearly polarized optical pulses to generate separate electrical signals, and the difference amplifier coupled to the photosensitive diodes for amplifying a difference between the separate electrical signals.

14. Apparatus as defined in claim 9, further comprising a low pass filter for filtering an output of the amplitude detector.

15. Apparatus as defined in claim 9, further comprising a display for displaying the detected amplitude.

* * * * *